United States Patent [19]
Mercer

[11] Patent Number: 5,612,697
[45] Date of Patent: *Mar. 18, 1997

[54] D/A CONVERTER WITH DIFFERENTIAL SWITCHING CIRCUIT PROVIDING SYMMETRICAL SWITCHING

[75] Inventor: Douglas A. Mercer, Bradford, Mass.

[73] Assignee: Analog Devices, Incorporated, Norwood, Mass.

[ * ] Notice: The term of this patent shall not extend beyond the expiration date of Pat. No. 5,450,084.

[21] Appl. No.: 365,300

[22] Filed: Dec. 28, 1994

Related U.S. Application Data

[62] Division of Ser. No. 106,047, Aug. 12, 1993, Pat. No. 5,450,084.

[51] Int. Cl.⁶ ............................................ H03M 1/80
[52] U.S. Cl. ............................................ 341/153; 341/136
[58] Field of Search ............................ 341/133, 136, 341/153; 327/563, 91

[56]    References Cited

U.S. PATENT DOCUMENTS 5,148,164  9/1992  Nakamura et al. ............... 341/136
5,331,322  7/1994  Cha et al. ........................ 341/136
5,373,294  12/1994  Sun ................................. 341/136
5,450,084  9/1995  Mercer ............................ 341/153

*Primary Examiner*—Marc S. Hoff
*Attorney, Agent, or Firm*—Parmelee, Bollinger & Bramblett

[57]    ABSTRACT

A digital-to-analog converter including a plurality of binarily-weighted stages each incorporating a differential switch-pair circuit which includes two matched bipolar switch transistors the bases of which are driven by a corresponding pair of complementarry signal sources. Two additional switches are included in this circuit, with each such switch being connected between a respective signal source and its corresponding transistor control electrode. These two switches are both opened before the clock-controlled activation of the complementary signal sources. A short time after such activation, sufficient to assure that the complementary signal voltages have stabilized at their new values, the two additional switches are reclosed simultaneously by a single control signal so as to effect synchronized switchover of the two switch transistors at that instant. Capacitors are included to maintain effectively constant the base voltages of the two switch transistors during the time that the two additional switches are open.

4 Claims, 5 Drawing Sheets

D/A CONVERTER WITH DIFFERENTIAL SWITCHING CIRCUIT PROVIDING SYMMETRICAL SWITCHING

This application is a divisional application of application Ser. No. 08/106,047, now U.S. Pat. No. 5,454,084, as originally filed on Aug. 12, 1993.

BACKGROUND OF THE INVENTION

1. Field of the Invention

This invention relates to digital-to-analog converters of the type employing differential switch circuits for switching the bit currents either to an output bus or to a circuit common line. More particularly, this invention relates to techniques for improving the performance of such differential switch circuits.

2. Description of the Prior Art

Digital-to-analog converters (DACs) generally have comprised a number of switches which are selectively operated by a multi-bit digital input signal to produce corresponding binarily-weighted bit currents to be summed as an analog output signal. Such converters ordinarily are formed as integrated circuits (ICs), with each switch comprising two bipolar transistors arranged as a differential switch-pair. As shown for example in U.S. Pat. No. 3,961,326 (R. B. Craven), the individual transistors of such a switch-pair typically are controlled by complementary signal sources which operate to turn one switch on while turning the other switch off. One of the two switches makes connection to a summing bus, and the other switch makes connection to a common line such as ground.

One problem with such prior art switching arrangements is that there is asymmetry in the switch turn-on and turn-off speeds. This can result in a momentary error in the DAC output until all of the switches have fully switched. This anomaly produces a glitch in the output which is code dependent and results in harmonic distortion or even non-harmonic spurs in the output spectrum.

A typical prior art switch circuit is shown in FIG. 1. The form of the output current from terminals IA, IB of this switch circuit is a function of the symmetry of the switching signals, and distortion of the output current could result from asymmetrical switching signals. However, even if the applied input signals INA, INB were perfectly symmetrical, the P-type differential switches MP1 and MP2 would introduce asymmetry in the complementary switching voltages VA, VB which control the switch transistors Q1, Q2. Such asymmetry results in transient output current distortion in any individual switch circuit. It also results in misalignment between the turn-on/turn-off times of the multiple switch-circuits employed in a DAC; that is, the timing of the separate switches of the DAC will not be synchronized properly due to the lack of symmetry with code dependency of the output current.

SUMMARY OF THE INVENTION

In a preferred embodiment of the invention, to be described hereinbelow in detail, there is provided a differential switch-pair circuit which includes two matched bipolar switch transistors the control electrodes (bases) of which are driven by a corresponding pair of complementary signal sources. Two additional switches are included in this circuit, with each switch being connected between one signal source and its corresponding transistor control electrode. These two switches are both opened before the clock-controlled activation of the complementary signal sources. At the time of activation, the complementary signal source voltages change (from high to low and vice versa) if the input bit for that switch circuit requires a reversal in the on/off status of the two switch transistors. A short time after such activation, sufficient to assure that the complementary signal voltages have stabilized at their new values, the two additional switches are reclosed simultaneously by a single control signal so as to effect synchronized switchover of the two switch transistors at that instant.

The preferred embodiment also includes capacitors arranged to maintain effectively constant the control electrode (base) voltages of the two transistors during the time that the two additional switches are open. When the switches are thereafter reclosed, the new control electrode voltages are applied symmetrically to the respective transistor bases, and the on/off status of the transistors is reversed if required by the corresponding bit of the input signal. This simultaneous reclosure of the two additional switches results in a much more symmetrical switching of the two transistor output currents.

Accordingly, it is an important aspect of the invention to improve the operation of differential switch-pair circuits. In another aspect, the invention provides significant improvements in the performance of digital-to-analog converters. Other objects, aspects and advantages of the invention will in part be pointed out in, and in part apparent from, the following description of a preferred embodiment considered together with the accompanying drawings.

DETAILED DESCRIPTION OF A PREFERRED EMBODIMENT

Figure 2:
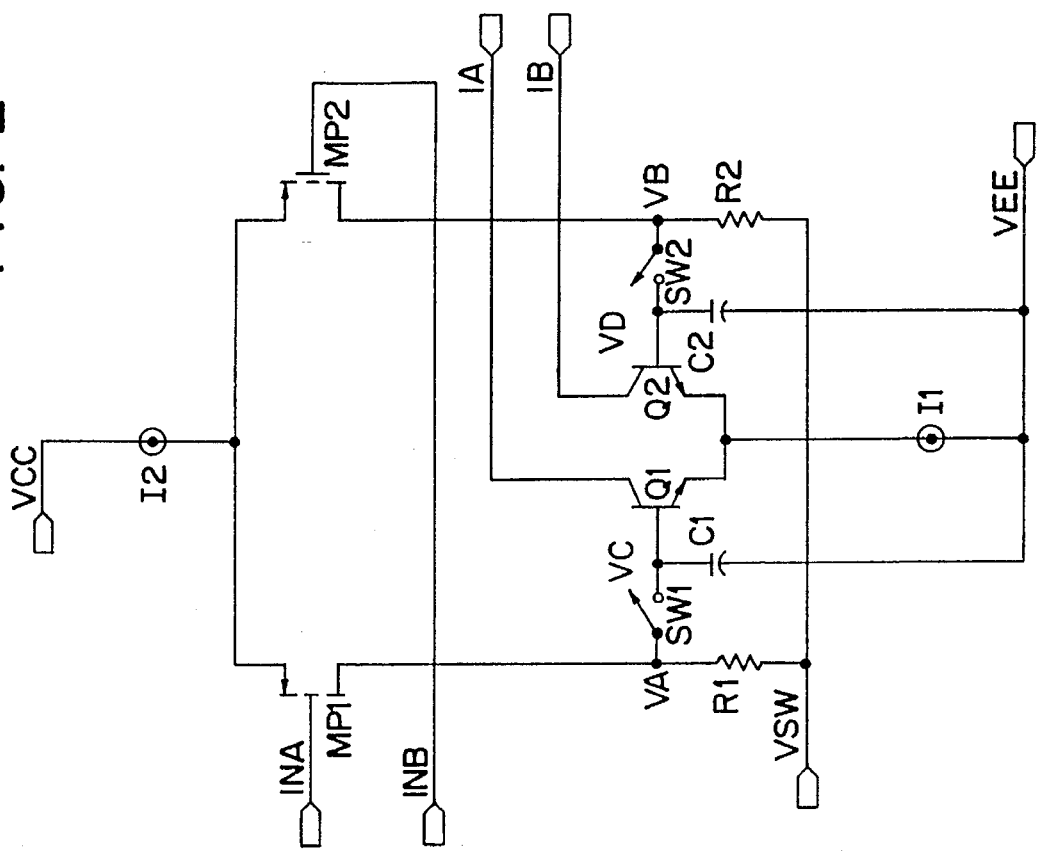
FIG. 2 is a simplified circuit diagram like that of FIG. 1, but modified in accordance with the present invention.
Figure 1:
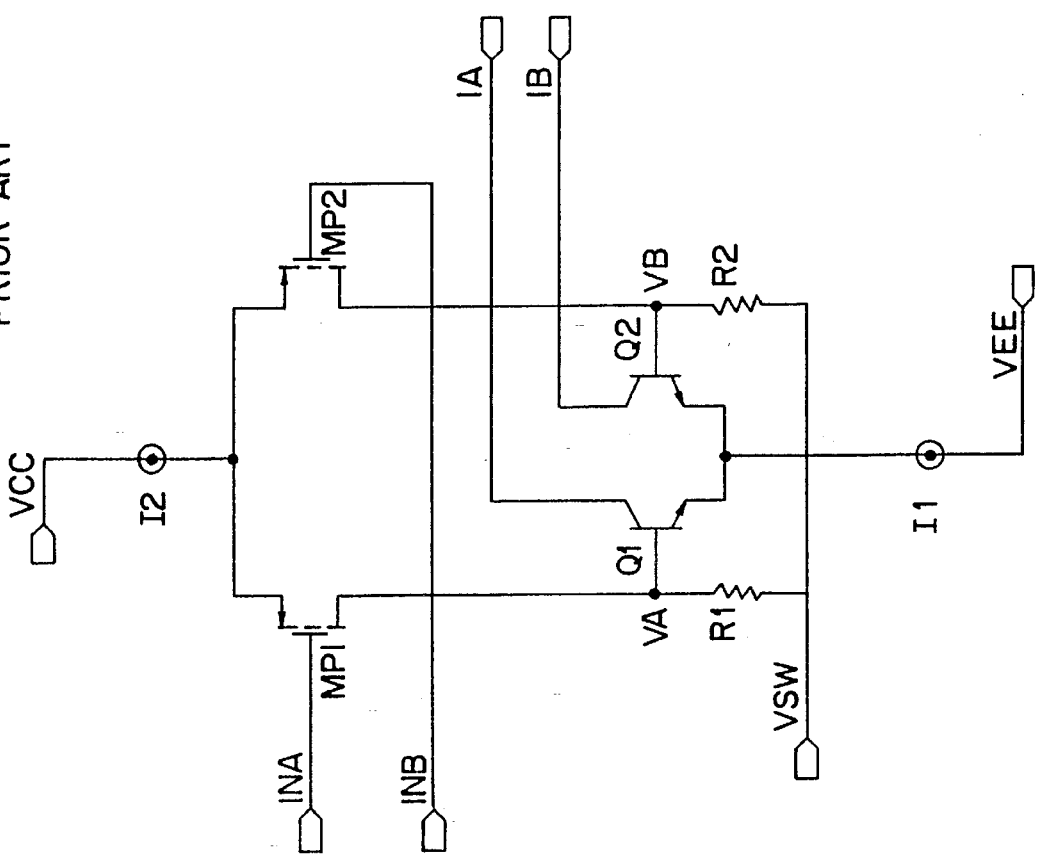
FIG. 1 is a simplified circuit diagram of a prior art switch circuit for use in a DAC.

Referring now to FIG. 2, there is shown a switch circuit comprising a pair of bipolar transistors Q1, Q2 having common emitter electrodes which are connected through a current source I1 to the negative supply line VEE. The collector electrodes are connected to respective terminals which lead respectively to an output current summing bus and a common line (typically circuit ground).

The base electrodes of transistors Q1, Q2 are connectible through respective switches SW1, SW2 to complementary signal sources which produce control voltages VA, VB. These signal sources include a current source I2 connected to the positive supply line VCC to produce currents for a differen- tially-operated pair of MOS transistors MP1 and MP2. The gates of these MOS transistors are driven by complementary input signals INA, INB, which together may represent one bit of a multi-bit input signal. The current from source I2 will flow either through MP1 or MP2, depending upon whether the input bit is high or low.

When the current from source I2 flows through MP1, it will produce a voltage across a resistor R1 and, when switch SW1 is closed, that voltage will turn transistor Q1 on. Alternatively, when the current from source I2 flows through MP2, it will produce a voltage across a resistor R2 and, when switch SW2 is closed, that voltage will turn transistor Q2 on. The bit current I1 thus will flow to either terminal IA or IB, depending upon the state of the digital input bit INA, INB.

The input signals INA, INB are activated by clock signals (to be described) and, when the corresponding bit signal requires a change in the switch state, one input signal (INA or INB) will change from high to low, while the other input signal changes from low to high. The switches SW1 and SW2 are opened a short time before this clocked activation of the input signals so that, at the clock time, the new input voltages VA, VB will have no effect on the base voltages VC, VD of the transistors Q1, Q2.

Capacitors C1, C2 are provided at the bases of the transistors Q1, Q2 to assure that the base voltages do not change appreciably while the switches SW1, SW2 are open. A short time after the clocked activation of the input signals VA, VB, the switches SW1, SW2 will close, and the new voltages VA, VB (if reversal of the input signals has occurred) then will be applied to the transistor bases as new voltages VC, VD. Both voltages VC and VD will be applied simultaneously because the switches SW1 and SW2 are controlled by a single hold signal (as will be described). Thus the transistors Q1, Q2 will switch together, thereby preventing asymmetrical operation.

Figure 3:
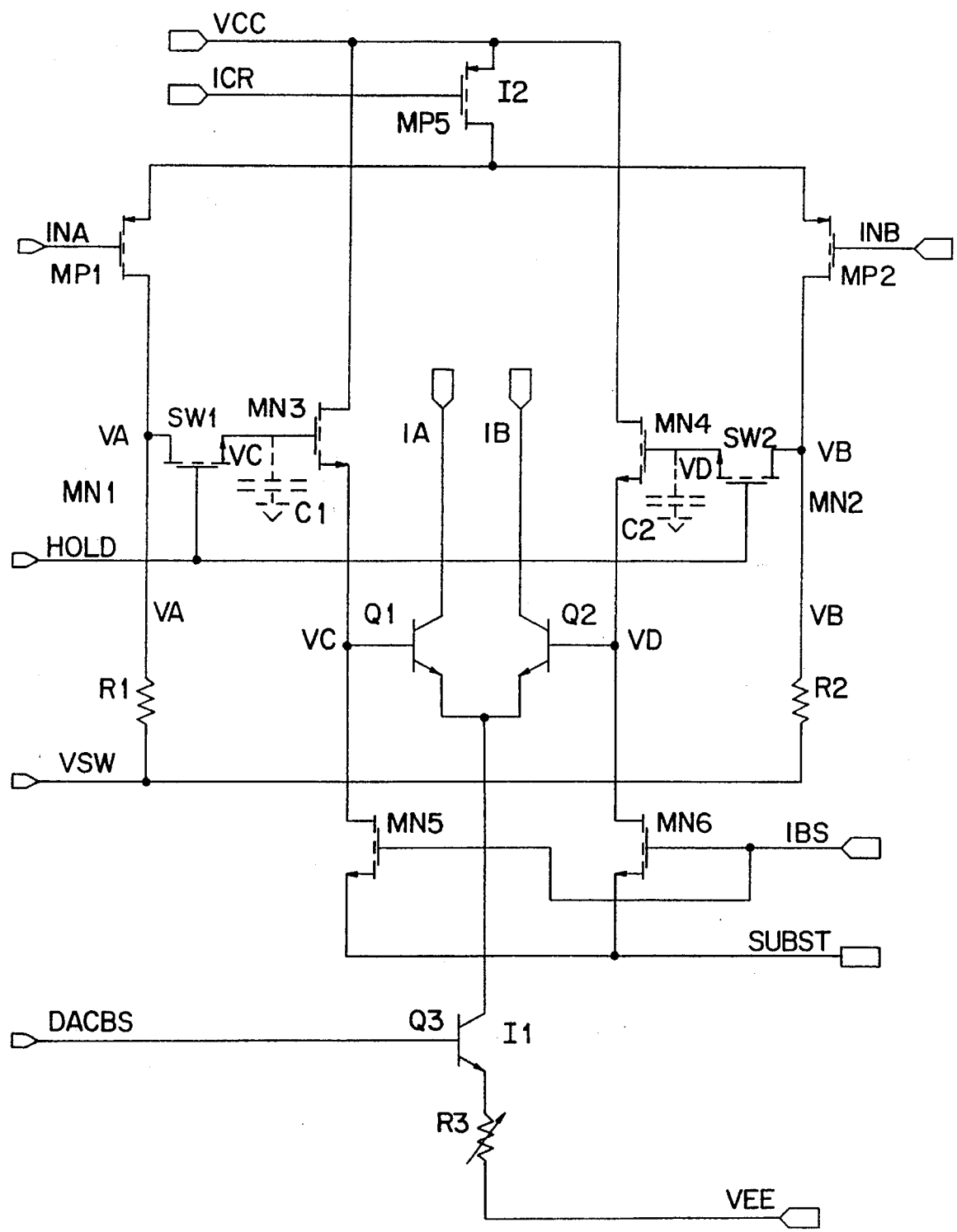
FIG. 3 is a circuit diagram of a commercially practicable switch circuit in accordance with this invention.

Referring now also to FIG. 3, showing a practical implementation of the circuit of FIG. 2, it will be seen that the bit current through transistors Q1 or Q2 is set by current source I1 which in this case comprises a bipolar transistor Q3 in series with a resistor R3 which is laser trimmed for precision setting of the bit current. The switches SW1 and SW2 are formed by respective MOS transistors MN1 and MN2, and two additional MOS transistors MN3, MN4 are provided as 1:1 buffer amplifiers between the switches SW1, SW2 and the corresponding control electrodes (bases) of the transistors Q1, Q2. The voltages VC and VD at the bases are the same as the voltages at the corresponding inboard switch terminals, as indicated on the diagram.

The current source I2 is an MOS transistor MP5 having a fixed bias voltage ICR on its gate to set the current level properly. The operating current for the buffers MN3, MN4 is derived from the positive supply line VCC, and is controlled by current source transistors MN5, MN6 the gates of which are biased by a voltage IBS. The current from the current sources MN5, MN6 flows to the IC chip substrate SUBST.

The capacitors C1, C2 at the inboard terminals of the switches SW1, SW2 are formed by the gate leads for the buffer transistors MN3, MN4. That is, the conductive metallization of the integrated circuit which makes connection to the gates of those MOS transistors is dimensioned to produce correctly-sized equal capacitances C1 and C2 (approximately one-quarter of a pico-farad in one embodiment) with respect to the underlying substrate of the chip to assure that the base voltages VC, VD are maintained at their initial levels while the switches SW1, SW2 are open.

Figure 4:
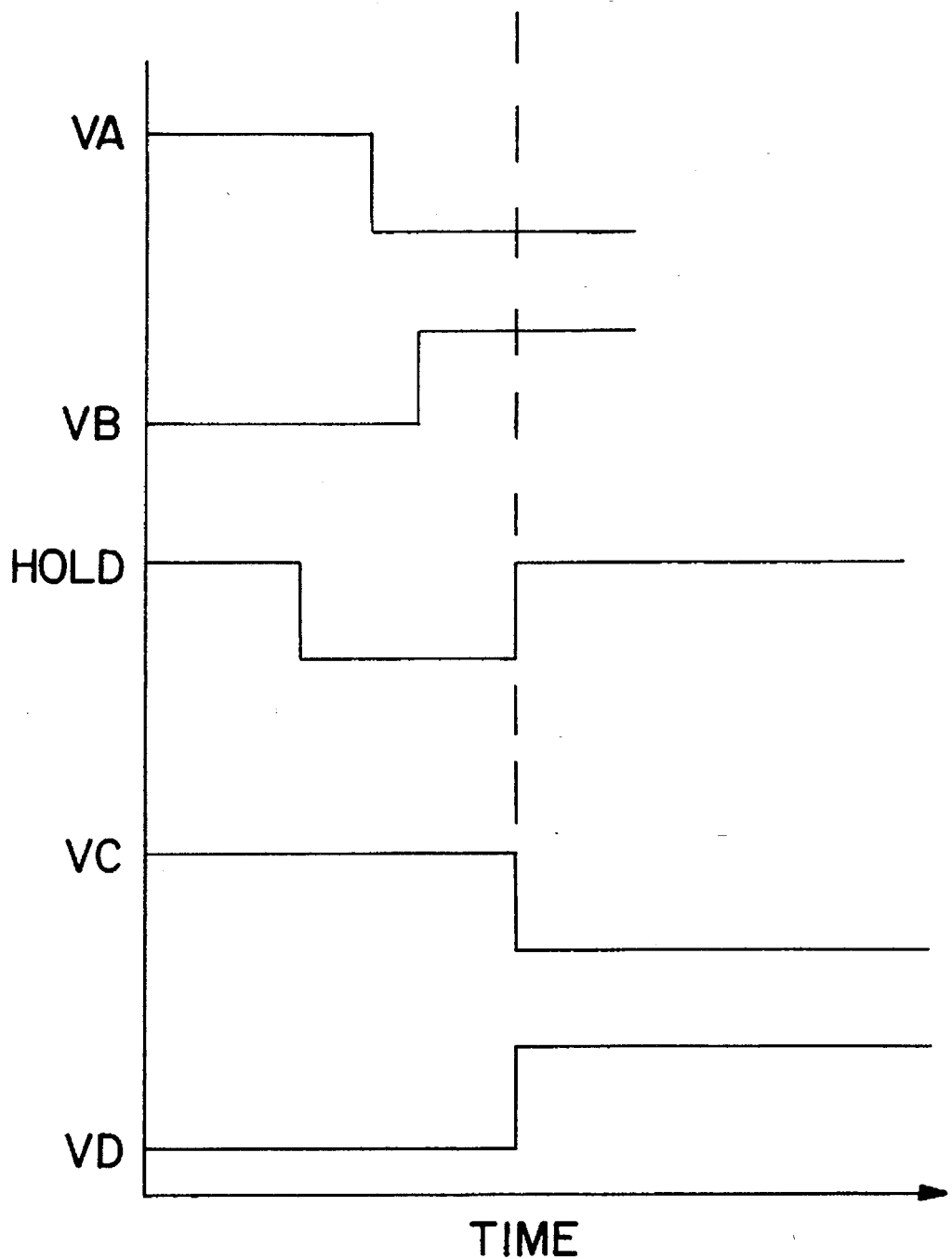
FIG. 4 is a timing diagram showing how certain voltages change with time during operation of the switch circuit of FIG. 3.

Referring now to FIG. 4, the timing diagram presents an example where changes in the input voltages VA, VB are misaligned such as due to an asymmetry as described above. Specifically, in this example VA changes from high to low at a time before VB changes from low to high. As noted previously, such misalignment would produce a distorted DAC output signal in conventional prior art circuits. However, in the preferred embodiment described herein, this timing misalignment does not affect the operation of the switch transistors Q1, Q2 because as shown in FIG. 4 the Hold signal went low to open switches SW1, SW2 before any change in either VA or VB. Thus these switches were, at the time of switchover of VA and VB, already open to prevent the changes in VA, VB from affecting the base voltages of the switch transistors.

After the voltages VA, VB have stabilized at their new values, the Hold signal for switches SW1, SW2 is returned to its high state, and the switches then close simultaneously. Thus, the stabilized new values of VA, VB will be applied simultaneously to the bases of transistors Q1, Q2, and the currents through those transistors will accordingly change together to their new values, without any misalignment.

Figure 5:
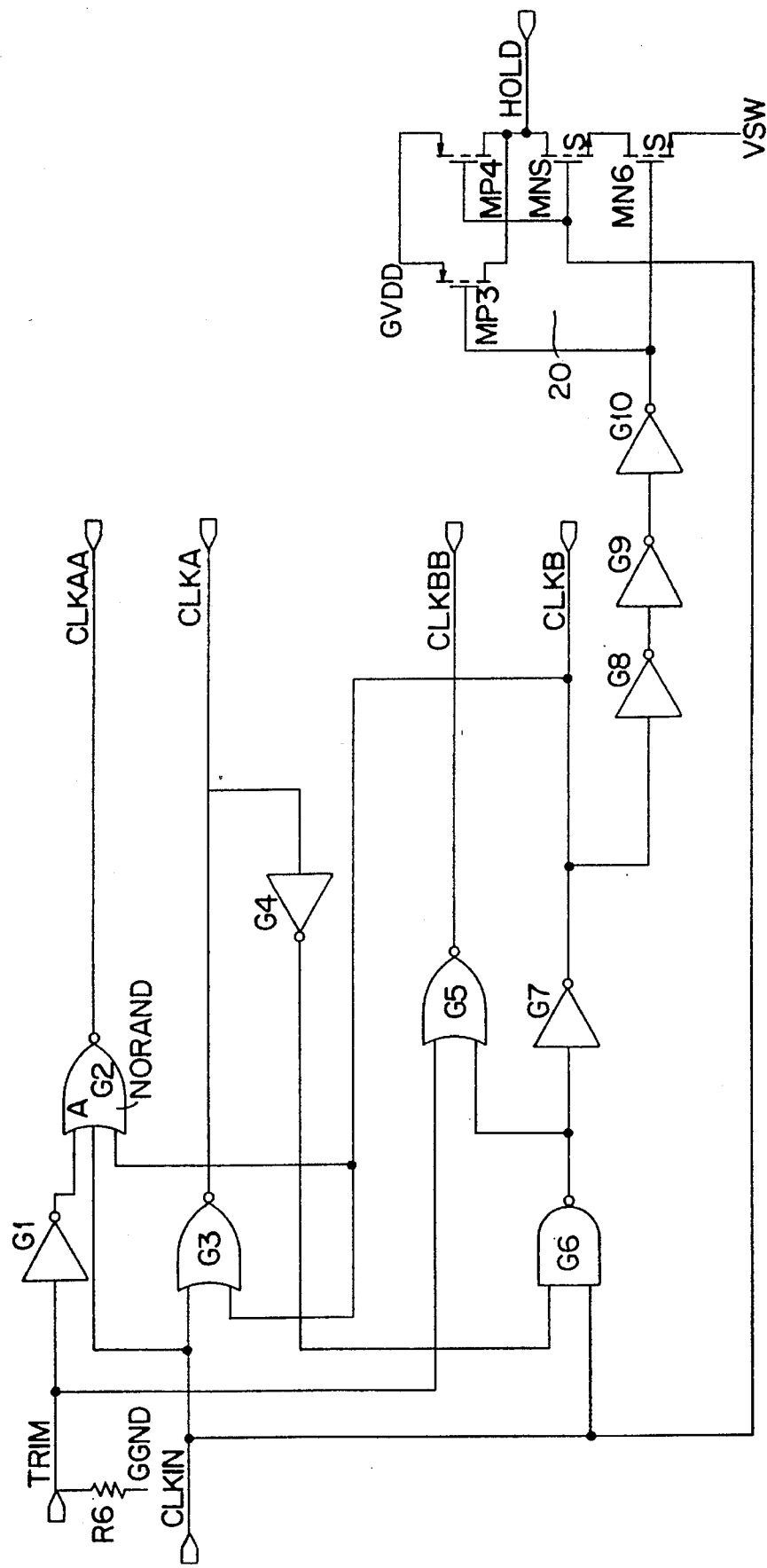
FIG. 5 is a circuit diagram of logic elements for use in controlling the timing of signals in a switch circuit as shown in FIG. 3.

FIG. 5 shows a circuit suitable for use in a DAC for developing the Hold signal referred to above. This circuit is for the most part basically a conventional logic circuit for receiving a master clock signal CLKIN, and producing clock signals CLKAA, CLKA, CLKBB and CLKB for the usual logic elements (not shown) associated with the registers used for temporarily storing the digital input signals prior to their application to the DAC current switches. The circuit also includes provision for disabling the clock signal activation upon a bias voltage being applied to the TRIM terminal for the purpose of conditioning the DAC circuitry for laser-trimming the resistor R3 to set the bit current with precision.

The circuit of FIG. 5 also includes a cluster of MOS transistors generally indicated at 20 to develop the Hold signal as described above. These transistors 20 are driven by the master clock signal CLKIN, and are also controlled by a clock signal delayed by inverters G8, G9 and G10. This circuit switches the Hold signal low at the correct time and maintains this low state for a time period appropriate for achieving the results described above. That is, the switches SW1, SW2 are opened just before any switchover of the input signals VA, VB, and are closed just after the new voltages VA, VB have become stabilized.

Figure 6:
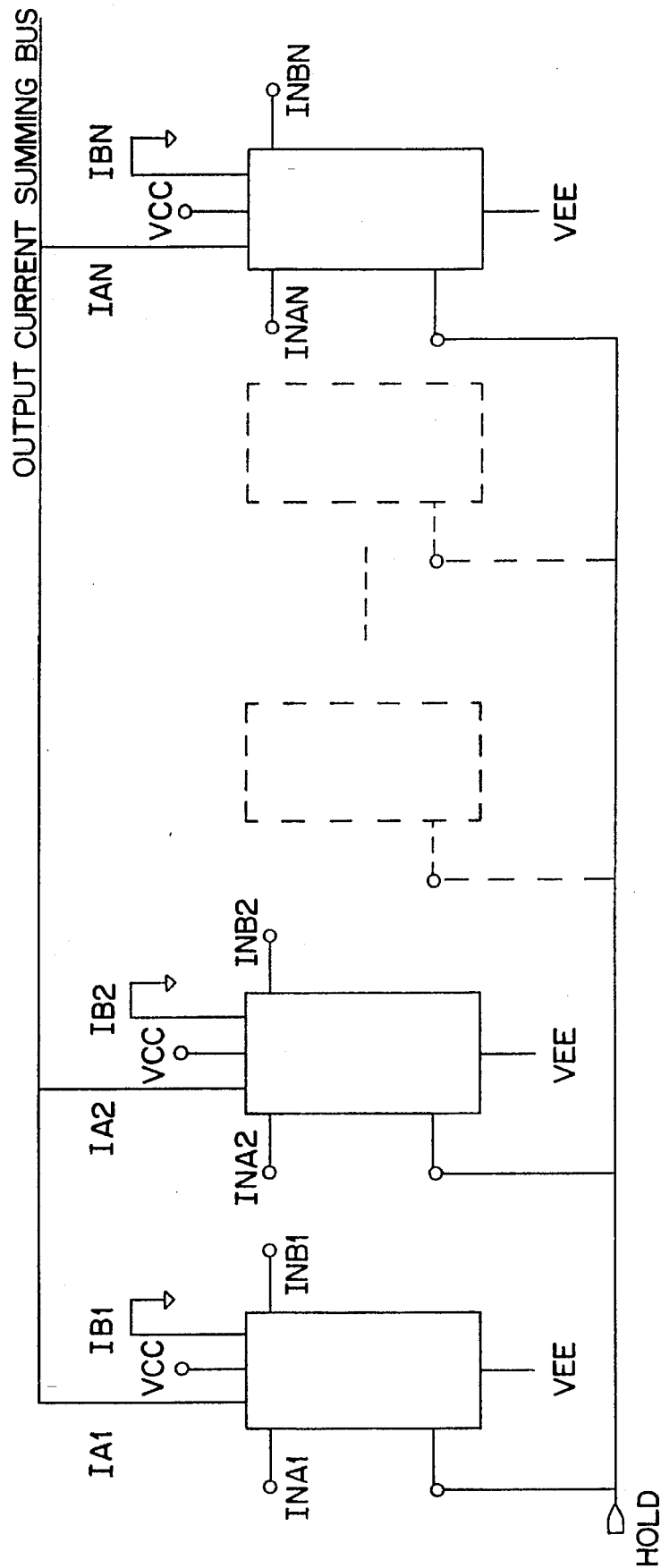
FIG. 6 is a circuit diagram showing in block format a digital-to-analog converter in accordance with this invention.

FIG. 6 shows in block outline a digital-to-analog converter formed by a plurality of binarily-weighted bit stages or cells 30-1, 30-2, ..., 30-N each comprising a differential switch circuit as described above. These differential switch circuits all are as shown in FIG. 3, and each includes a pair of switches SW1, SW2 for isolating the initial change in voltages VA, VB to prevent such voltage change from affecting the bases of the transistors Q1, Q2.

After those voltages VA, VB have stabilized at their new values (if the voltages have been changed), the switches SW1, SW2 in all of the switch cells close simultaneously to apply the new voltages to the base electrodes of all of the switch transistors Q1, Q2 at the same instant. It should particularly be noted that the high Hold signal will be applied to all stages 30-1, 30-2, etc., of the DAC simultaneously, thereby assuring alignment of switchover times for all of those stages so as to avoid distortion in the output signal that would otherwise be caused by misalignment in switchover times between the individual DAC stages.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

I claim:

1. In a differential switch-pair circuit comprising two switch devices each having two current-carrying electrodes and a control electrode; said switch-pair circuit including complementary signal sources arranged to be coupled respectively to said control electrodes and operable when activated and coupled to those electrodes to turn one switch device on and to turn the other switch device off;

the method of operating said switch-pair circuit which comprises:
      isolating said complementary signal sources from the corresponding control electrodes; and
      thereafter removing the isolation of said signal sources and applying said signal sources to said control electrodes at the same time.

2. The method of claim 1, wherein said isolation step takes place prior to activation of said sources.

3. The method of claim 2, including the step of activating said signal sources after said isolation step.

4. A digital-to-analog converter comprising a plurality of switch circuits individually switchable into either of two states in accordance with an applied control signal representing one bit of a multi-bit input signal; each of said switch circuits serving when in one of said states to produce a current for an analog output signal and comprising a differential switch-pair circuit including two switch devices each having two current-carrying electrodes and a control electrode wherein one common pair of said current-carrying electrodes of said two switch devices are effectively connected together and the other common pair of current-carrying electrodes are connected to respective current lines;

the method of operating any of said switch-pair circuits comprising the steps of:
   (1) isolating inactivated complementary signal sources from the respective control electrodes of the pair of switch devices for the switch-pair circuit to be operated;
   (2) activating said isolated signal sources; and
   (3) removing the isolation of said complementary signal sources to apply the outputs of said complementary signal sources simultaneously to said control electrodes respectively of the pair of switch devices for the switch-pair circuit to be operated.

* * * * *